(12) United States Patent
Yokoyama

(10) Patent No.: US 12,045,920 B2
(45) Date of Patent: Jul. 23, 2024

(54) COMPONENT MOUNTING MANAGEMENT APPARATUS, COMPONENT MOUNTING MANAGEMENT METHOD, COMPONENT MOUNTING MANAGEMENT PROGRAM, AND RECORDING MEDIUM

(71) Applicant: YAMAHA HATSUDOKI KABUSHIKI KAISHA, Iwata (JP)

(72) Inventor: Yoshiyuki Yokoyama, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 400 days.

(21) Appl. No.: 17/600,546

(22) PCT Filed: May 30, 2019

(86) PCT No.: PCT/JP2019/021539
§ 371 (c)(1),
(2) Date: Sep. 30, 2021

(87) PCT Pub. No.: WO2020/240774
PCT Pub. Date: Dec. 3, 2020

(65) Prior Publication Data
US 2022/0180580 A1 Jun. 9, 2022

(51) Int. Cl.
*G06F 11/32* (2006.01)
*G06T 11/00* (2006.01)
(Continued)

(52) U.S. Cl.
CPC .......... *G06T 11/206* (2013.01); *G06T 11/001* (2013.01); *H05K 13/0815* (2018.08); *G06F 11/324* (2013.01)

(58) Field of Classification Search
None
See application file for complete search history.

(56) References Cited

U.S. PATENT DOCUMENTS 5,295,065 A * 3/1994 Chapman ............... G06Q 10/06
700/99
5,537,325 A * 7/1996 Iwakiri ............. H01L 21/67282
700/121
(Continued)

FOREIGN PATENT DOCUMENTS

| CN | 102143680 A | 8/2011 |
| JP | 2008-112209 A | 5/2008 |
| JP | 2012-33070 A | 2/2012 |

OTHER PUBLICATIONS

An Office Action mailed by China National Intellectual Property Administration on Sep. 30, 2022, which corresponds to Chinese Patent Application No. 201980096032.7 and is related to U.S. Appl. No. 17/600,546.
(Continued)

*Primary Examiner* — Jason Lin
(74) *Attorney, Agent, or Firm* — Studebaker & Brackett PC (57) ABSTRACT

A component mounting management apparatus having a display. A timing chart indicating the execution history of the component mounting operation is displayed on the display. In this timing chart, a plurality of marks corresponding to a plurality of boards, respectively, are arranged along the time axis. Each of the marks is disposed at a position on the time axis in accordance with the execution timing of the component mounting operation on the board corresponding to the mark and has a width depending on the operation time needed to perform the component mounting operation on the board corresponding to the mark along the time axis. That is, each of the plurality of marks arranged along the time axis in the timing chart indicates the execution timing and the operation time of the component mounting operation on the corresponding board.

18 Claims, 7 Drawing Sheets

(51) Int. Cl.
 *G06T 11/20* (2006.01)
 *H05K 13/08* (2006.01)

(56) References Cited

U.S. PATENT DOCUMENTS

| | | | | |
|---|---|---|---|---|
| 5,943,484 A * | 8/1999 | Milne | ............. | G06Q 10/06 700/95 |
| 6,263,254 B1 * | 7/2001 | Nishimura | ....... | G05B 19/41865 700/97 |
| 6,295,478 B1 * | 9/2001 | Inada | ............. | G05B 23/024 700/109 |
| 6,490,495 B1 * | 12/2002 | Murata | ............. | H01R 43/052 700/111 |
| 6,810,429 B1 * | 10/2004 | Walsh | ............. | G06F 16/258 709/246 |
| 7,035,877 B2 * | 4/2006 | Markham | ........ | G05B 19/41875 |
| 7,543,259 B2 * | 6/2009 | Oohashi | ............. | H05K 13/08 703/1 |
| 8,060,396 B1 * | 11/2011 | Bessler | ............. | G06Q 10/0633 705/7.22 |
| 9,807,920 B2 * | 10/2017 | Kurata | ............. | H05K 13/08 |
| 10,628,765 B2 * | 4/2020 | Aparimit | ........ | G06Q 10/063114 |
| 11,143,689 B2 * | 10/2021 | Teplinsky | ............. | G06Q 50/04 |
| 2003/0109945 A1 * | 6/2003 | Cho | ............. | G05B 19/41875 700/121 |
| 2004/0049398 A1 * | 3/2004 | Gartland | ............. | G06Q 10/08 700/110 |
| 2006/0020361 A1 * | 1/2006 | Ohishi | ............. | G06Q 10/06 700/115 |
| 2008/0103715 A1 | 5/2008 | Tsuda et al. | | |
| 2009/0024239 A1 * | 1/2009 | Yoshioka | ............. | G06Q 10/06 700/110 |
| 2016/0085734 A1 * | 3/2016 | Piccazzo | ............. | G06F 40/143 715/234 |

OTHER PUBLICATIONS

International Search Report issued in PCT/JP2019/021539; mailed Aug. 27, 2019.

* cited by examiner

| START DATE AND TIME | END DATE AND TIME | LINE NAME |
|---|---|---|
| 2019/04/01 0:00:00 | 2019/04/09 0:00:00 | LINE La |

LIST OF SUBSTRATE TYPES

| PRODUCTION START DATE AND TIME | PRODUCTION END DATE AND TIME | PRODUCED SUBSTRATE TYPE | NUMBER OF PRODUCED SUBSTRATE |
|---|---|---|---|
| ... | ... | ... | ... |
| ... | ... | ... | ... |

LINE NAME: LINE La

START DATE AND TIME: 2019/04/01 0:00:00
END DATE AND TIME: 2019/04/09 0:00:00

LIST OF SUBSTRATE TYPES

| PRODUCTION START DATE AND TIME | PRODUCTION END DATE AND TIME | PRODUCED SUBSTRATE TYPE | NUMBER OF PRODUCED SUBSTRATE |
|---|---|---|---|
| ... | ... | ... | ... |

ERROR DETAIL

| DATE AND TIME | ERROR CONTENT |
|---|---|
| ... | OUT OF COMPONENTS |

(Time-based bar chart: R1, R2, R3, R4, R5, R6)

(Number of production graph, 9:00–15:00)

APPARATUS 4a P
APPARATUS 4b P
APPARATUS 4c P
APPARATUS 4d P

COMPONENT MOUNTING MANAGEMENT APPARATUS, COMPONENT MOUNTING MANAGEMENT METHOD, COMPONENT MOUNTING MANAGEMENT PROGRAM, AND RECORDING MEDIUM

CROSS-REFERENCE TO RELATED APPLICATION

This application is a National Stage of International Patent Application No. PCT/JP2019/021539, filed May 30, 2019, the entire contents of which is incorporated herein by reference.

BACKGROUND

Technical Field

The present disclosure relates to a technique for managing a component mounting system which produces component-mounted boards.

Background Art

A component mounting system for producing component-mounted boards is generally used. In a production site using such a component mounting system, in order to increase the efficiency of board production, a manager grasps an operating state of the component mounting system and performs a necessary operation. On the other hand, Japanese Patent Application Laid Open Gazette No. 2008-112209 discloses a technique for monitoring an operating state of a production apparatus for producing electric equipments, machines, components or the like.

SUMMARY

For the manager who manages production of component-mounted boards, however, it is suitable to easily grasp the operating state of the component mounting system on a board-by-board basis. On the other hand, the technique shown in Patent Document 1 cannot meet such needs of the manager.

Accordingly, the present disclosure provides a technique that makes it possible for the manager who manages production of component-mounted boards to easily grasp the operating state of the component mounting system on a board-by-board basis.

A component mounting management apparatus according to the disclosure, comprises a display; and a control part which displays a chart on the display. The chart indicates an execution history of a predetermined operation in a component mounting system which produces a component-mounted board by performing the predetermined operation on a board at an operation position while sequentially transferring a plurality of boards to the operation position. In the chart, by disposing a mark corresponding to the board at a position on a time axis in accordance with an execution timing of the predetermined operation on the board corresponding to the mark, a plurality of marks corresponding to the plurality of boards are arranged along the time axis, and each of the plurality of marks has a width, along the time axis, depending on an operation time needed to perform the predetermined operation on the corresponding board.

A component mounting management method according to the disclosure, comprises displaying a chart, on a display, which indicates an execution history of a predetermined operation in a component mounting system which produces a component-mounted board by performing the predetermined operation on a board at an operation position while sequentially transferring a plurality of boards to the operation position. In the chart, by disposing a mark corresponding to the board at a position on a time axis in accordance with an execution timing of the predetermined operation on the board corresponding to the mark, a plurality of marks corresponding to the plurality of boards are arranged along the time axis, and each of the plurality of marks has a width, along the time axis, depending on an operation time needed to perform the predetermined operation on the corresponding board.

A component mounting management program according to the disclosure causes a computer to execute the step of displaying a chart, on a display, which indicates an execution history of a predetermined operation in a component mounting system which produces a component-mounted board by performing the predetermined operation on a board at an operation position while sequentially transferring a plurality of boards to the operation position. In the chart, by disposing a mark corresponding to the board at a position on a time axis in accordance with an execution timing of the predetermined operation on the board corresponding to the mark, a plurality of marks corresponding to the plurality of boards are arranged along the time axis, and each of the plurality of marks has a width, along the time axis, depending on an operation time needed to perform the predetermined operation on the corresponding board.

A recording medium according to the disclosure records the above component mounting management program in a computer-readable manner.

According to the present disclosure (the component mounting management apparatus, the component mounting management method, the component mounting management program, and the recording medium) having such a configuration, a chart indicating an execution history of a predetermined operation in a component mounting system for producing a component-mounted board, by performing the predetermined operation on a board at an operation position while sequentially transferring a plurality of boards to the operation position, is displayed on the display. In this chart, a plurality of marks corresponding to the plurality of boards are arranged along a time axis. Each mark is disposed at a position on the time axis in accordance with an execution timing of the predetermined operation on the board corresponding to the mark, and has a width, along the time axis, depending on an operation time needed to perform the predetermined operation on the corresponding board. In other words, each of the plurality of marks arranged along the time axis in the chart indicates the execution timing and the operation time of the predetermined operation on the corresponding board. Therefore, the manager can grasp the execution timing and the operation time of the predetermined operation on a board-by-board basis by checking this chart. Thus, it is possible for the manager who manages production of component-mounted boards to easily grasp the operating state of the component mounting system on a board-by-board basis.

The component mounting management apparatus may be configured so that the control part changes a color of the mark depending on an excess amount so that the plurality of marks each have a color depending on the excess amount of the operation time on the corresponding board with respect to a reference time. With such a configuration, the manager can easily distinguish a board needing a long operation time by the color.

The component mounting management apparatus may further comprise a setting part which receives a setting operation of a manager who sets a correspondence between the excess amount and the color of the mark, wherein the control part changes the color of the mark depending on the excess amount in accordance with the correspondence. With such a configuration, by operating the setting part, the manager can check the board needing a long operation time by the color while changing the color of the mark depending on the operation time.

The component mounting management apparatus may be configured so that the control part displays the number of boards, among the plurality of boards, each whose operation time exceeds the reference time, an excess time of each board whose operation time exceeds the reference time, or the total of the excess times of all the boards each whose operation time exceeds the reference time, on the display. Such a display helps the manager to analyze the factor of causing a long operation time to be needed.

The component mounting management apparatus may be configured so that the control part displays information on the board, for each color of the corresponding mark, in a list format on the display. Such a display helps the manager to analyze the factor of causing a long operation time to be needed.

The component mounting management apparatus may further comprise a specification part which receives a specification operation of specifying one mark out of the plurality of marks, wherein the control part displays information in accordance with the one mark specified by the specification operation, on the display. With such a configuration, by specifying one mark, the manager can check the information in accordance with the one mark on the display.

The component mounting management apparatus may be configured so that the control part displays information on the board corresponding to the one mark, on the display. With such a configuration, by specifying one mark in the specification operation, the manager can check the information on the board corresponding to the one mark on the display.

The component mounting management apparatus may be configured so that the control part displays a phenomenon occurring during the operation time for the board corresponding to the one mark and time needed for the phenomenon, on the display. With such a configuration, by specifying one mark in the specification operation, the manager can check the phenomenon occurring during the operation time for the board corresponding to the one mark on the display.

The component mounting management apparatus may be configured so that the control part displays an error occurring during the operation time for the board corresponding to the one mark, on the display. With such a configuration, by specifying one mark in the specification operation, the manager can check the error occurring during the operation time for the board corresponding to the one mark on the display.

The component mounting management apparatus may be configured so that the component mounting system comprises a plurality of equipments each having the operation position, and the control part displays information on the board on which the predetermined operation is performed at the operation position of the equipment, for each equipment, in a list format on the display. With such a configuration, the manager can check the information on the board for each equipment.

According to the present disclosure, it becomes possible for a manager who manages the production of component-mounted boards to easily grasp the operating state of the component mounting system on a board-by-board basis.

DETAILED DESCRIPTION

Figure 1:
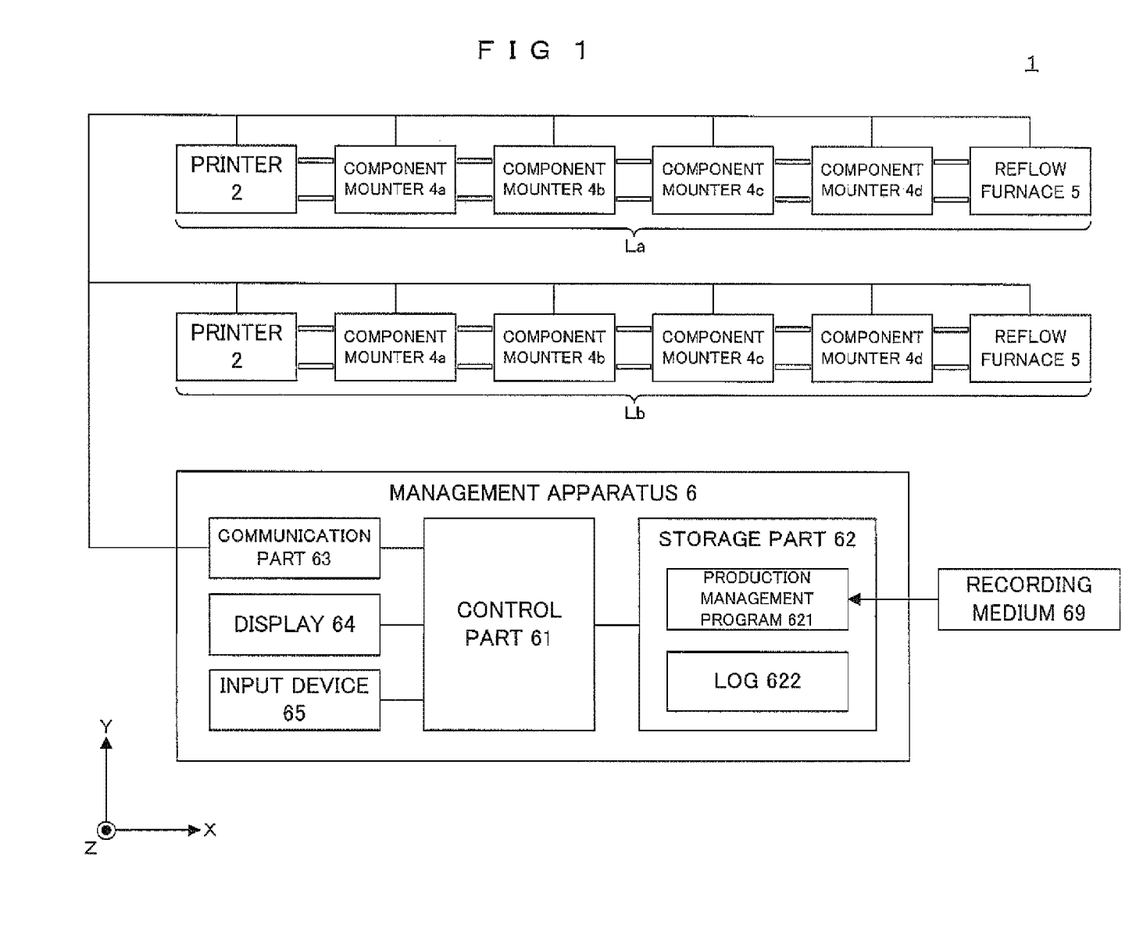
FIG. 1 is a block diagram schematically showing a board production facility including a production line which corresponds to one example of a component mounting system in accordance with the present disclosure.

FIG. 1 is a block diagram schematically showing a board production facility including a production line which corresponds to one example of a component mounting system in accordance with the present disclosure. FIG. 1 and the following figures each show an XYZ rectangular coordinate system with a Z direction as a vertical direction and with an X direction and a Y direction each as a horizontal direction. As shown in FIG. 1, the board production facility 1 includes two production lines La and Lb. Since these production lines La and Lb have almost the same configuration, the production line La will be mainly described below, and description on the production line Lb will be omitted as appropriate, with corresponding reference signs given thereto. In this production line La, a printer 2, a plurality of (four) component mounters 4a to 4d, and a reflow furnace 5 are arranged in series in the X direction which is a board transfer direction.

The printer 2 prints a coating material (solder) on a board by screen printing. The component mounters 4a to 4d each have a configuration described later with reference to FIG. 2 and mount components on the board on which the solder is printed by the printer 2. The reflow furnace 5 heats the board on which the components are mounted by the component mounters 4a to 4d, to thereby melt the solder with which the components and the board are bonded. Thus, the production line La performs solder printing, component mounting, and reflow on the board while transferring the board in the X direction, to thereby produce the board (component-mounted board) on which the components are mounted.

Further, the board production facility 1 includes a management apparatus 6 for controlling the production lines La and Lb. The management apparatus 6 includes a control part 61, a storage part 62, a communication part 63, a display 64, and an input device 65. The control part 61 is a processor such as a CPU (Central Processing Unit) or the like and executes an arithmetic operation needed to control the production lines La and Lb.

The storage part 62 is formed of a HDD (Hard Disk Drive) or the like and stores data and programs needed to control the production lines La and Lb. Especially, the storage part 62 stores a production management program 621, and the control part 61 executes the production management program 621, to thereby perform a board production management described later. The production management program 621 is provided, being recorded in the recording medium 69 in a computer-readable manner. The recording medium 69 is, for example, a HDD equipped in an external computer, and it is downloaded from the HDD (recording medium 69) of the external computer into the management apparatus 6 and stored into the storage part 62. Further, the recording medium 69 is not limited to the HDD but may be a USB flash drive, an optical disk, or the like.

The communication part 63 performs wired or wireless communication with each of the apparatuses 2, 4a to 4c, and 5 provided in the production lines La and Lb. This communication part 63 collects a log 622 indicating an operation history of each of the apparatuses 2, 4a to 4c, and 5 in response to, for example, a command of the control part 61 and stores the log 622 into the storage part 62.

The display 64 displays later-described information to a manager, and the input device 65 receives an input operation of the manager. The management apparatus 6 is formed of a personal computer or a tablet. In the former case, the input device 65 is a mouse or a keyboard, and in the latter case, the display 64 and the input device 65 are integrally formed as a touch panel display.

Figure 2:
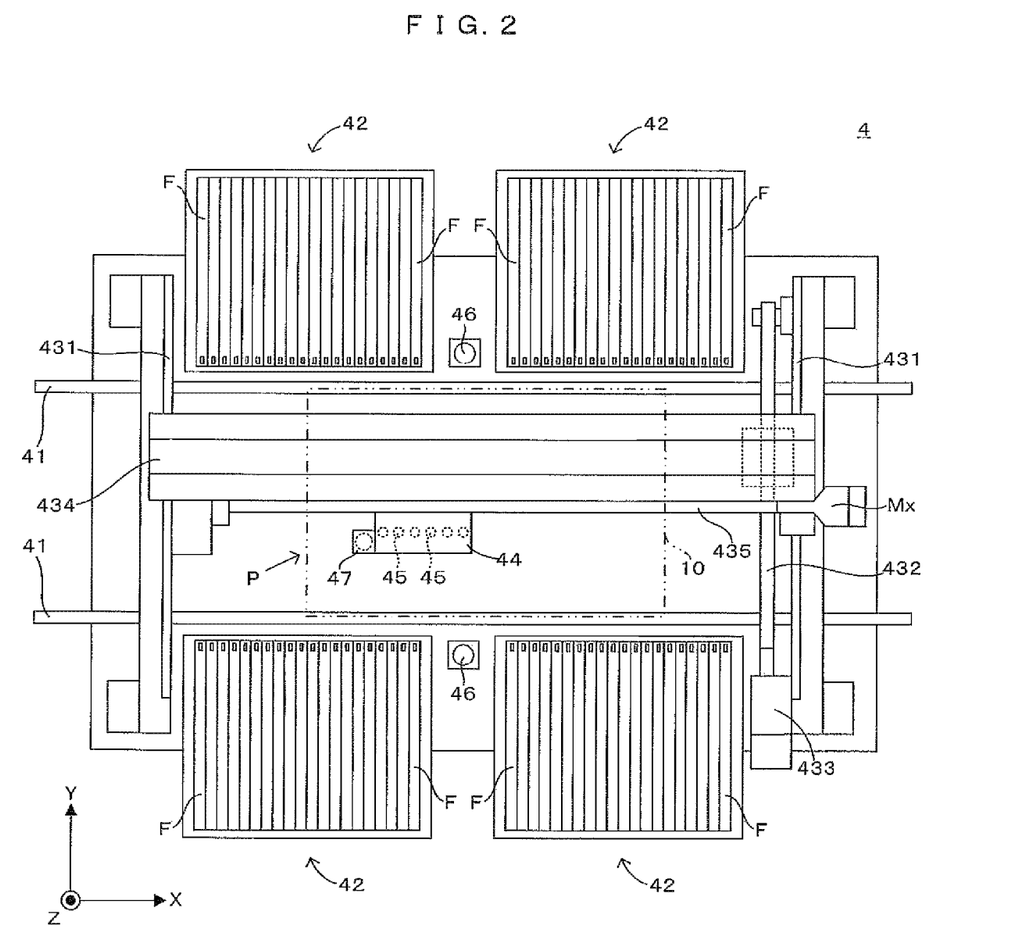
FIG. 2 is a partial plan view schematically showing a component mounter included in each production line in the board production facility of FIG. 1.

FIG. 2 is a partial plan view schematically showing the component mounter included in each production line in the board production facility of FIG. 1. In FIG. 2, the component mounters 4a to 4d are not distinguished from one another and each of them is referred to as a component mounter 4. The component mounter 4 includes a pair of conveyors 41 arranged in parallel in the X direction and transfers a board 10 by using these conveyors 41. Specifically, the component mounter 4 mounts the components on the board 10 which is loaded from an upstream side in the X direction to a mounting operation position P (the position of the board 10 in FIG. 2) by the conveyors 41, and unloads the board 10 on which the component mounting is completed from the mounting operation position P to a downstream side in the X direction by using the conveyors 41. Further, mounting of the components on the board 10 refers to an operation of placing the components on the solder printed on the board 10.

On each of both sides of the pair of conveyors 41 in the Y direction, two component supply parts 42 are aligned in the X direction, and in each of the component supply parts 42, a plurality of feeders F are arranged in the X direction. For each of the feeders F, disposed is a component supply reel wound with a component supply tape in which chip-like components such as an integrated circuit, a transistor, a capacitor, and the like are accommodated at predetermined pitches, and each feeder F intermittently feeds out the component supply tape drawn from the component supply reel, to thereby supply the components to a tip portion thereof.

The component mounter 4 is provided with a pair of Y-axis rails 431 extending in the Y direction, a Y-axis ball screw 432 extending in the Y direction, and a Y-axis motor 433 which rotationally drives the Y-axis ball screw 432. The pair of Y-axis rails 431 support an X-axis beam 434 extending in the X direction, movably in the Y direction, and the X-axis beam 434 is fixed to a nut of the Y-axis ball screw 432. To the X-axis beam 434, attached are an X-axis ball screw 435 extending in the X direction and an X-axis motor 436 which rotationally drives the X-axis ball screw 435. The X-axis beam 434 supports a head unit 44 movably in the X direction, and the head unit 44 is fixed to a nut of the X-axis ball screw 435. Therefore, the head unit 44 can be moved in the Y direction when the Y-axis motor 433 rotates the Y-axis ball screw 432, and the head unit 44 can be moved in the X direction when the X-axis motor 436 rotates the X-axis ball screw 435.

The head unit 44 has a plurality of (six) mounting heads 45 aligned in the X direction. Each of the head units 44 has a long shape extending in the Z direction, and at a lower end of the head unit 44, a nozzle for adsorbing the components is attached in a detachable/attachable manner. The head unit 44 uses the nozzle to move and place the components from the feeder F onto the board 10 positioned at the mounting operation position P, to thereby perform the component mounting.

Specifically, the mounting head 45 causes the nozzle to face the tip portion of the feeder F from above. Next, the mounting head 45 moves down to bring the nozzle into contact with the components supplied to the tip portion of the feeder F. Subsequently, the mounting head 45 moves up while using the nozzle to adsorb the components. After the mounting head 45 completes pickup of the components from the feeder F thus, the mounting head 45 moves to above the board 10 positioned at the mounting operation position P. Then, the mounting head 45 releases the adsorption of the components by the nozzle, to thereby mount the components on the board 10.

Between the two component supply parts 42 aligned in the X direction, disposed is a component recognition camera 46 facing upward, and the component recognition camera 46 checks whether or not there is an adsorption error, on the basis of a captured image. Specifically, the nozzle moving from the feeder F to the board 10 for component mounting goes through a field of view of the component recognition camera 46 and the component recognition camera 46 captures an image at the timing when the nozzle reaches the field of view. Then, the component recognition camera 46 detects occurrence of adsorption error on the basis of whether or not there is a component adsorbed by the nozzle, a tilt of the component, or the like. Further, when the occurrence of adsorption error is confirmed, the mounting head 45 moves the nozzle back to above the tip portion of the feeder F and retries adsorption of the components by the nozzle.

Furthermore, to the head unit 44, attached is a board recognition camera 47 facing downward and the board recognition camera 47, accompanying the head unit 44, moves in the X direction and the Y direction. The board recognition camera 47 recognizes the position of the board 10 on the basis of an image capturing a fiducial mark from above, a fiducial mark being affixed to the board 10 loaded to the mounting operation position P. Then, on the basis of the recognition result, the position of the component to be mounted by the mounting head 45 is adjusted in the X direction and the Y direction. Further, the component mounter 4 is also used for capturing an image of the components mounted on the board.

Figure 3:
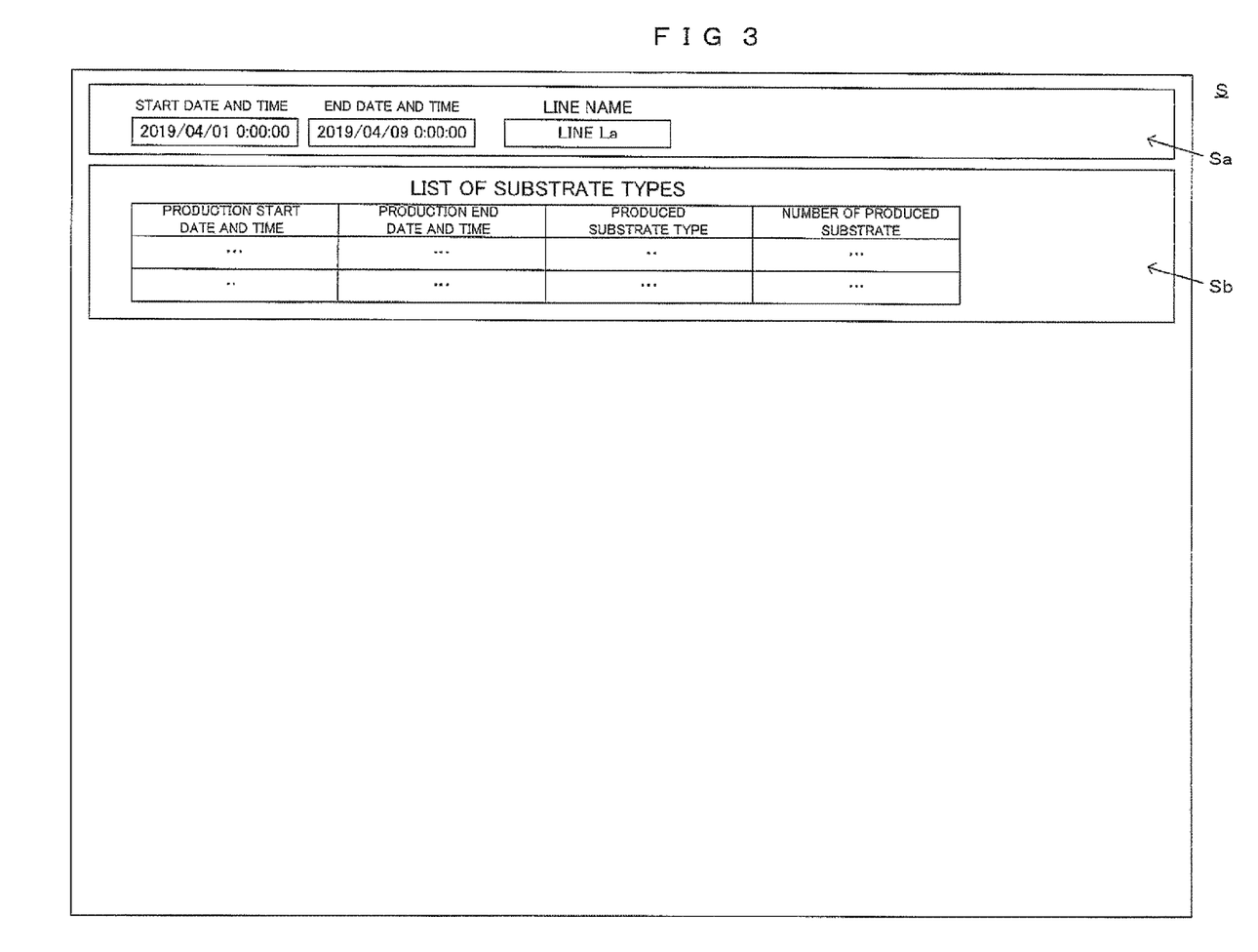
FIG. 3 is a view schematically showing an exemplary production management screen displayed on a display of a management apparatus.

Subsequently, the board production management performed by the management apparatus 6 in the board production facility 1 shown in FIG. 1 will be described. FIG. 3 is a view schematically showing an exemplary production management screen displayed on the display of the management apparatus. The control part 61 controls the display 64 to display the production management screen S, and the following items to be displayed on the production management screen S are obtained by the arithmetic operation of the control part 61 on the basis of the log 622.

The production management screen S has a setting part Sa. The setting part Sa is used for setting targets to be displayed on the production management screen S. Specifically, by operating the input device 65, the manager can perform setting of a target period (start date and time to end date and time) and setting of one target production line (line name) out of the plurality of production lines La and Lb in the setting part Sa. Further, in the exemplary case of FIG. 3, the production line La is set as the target production line.

Furthermore, the production management screen S has a board type display part Sb. The board type display part Sb displays a list of board types each of which complies with the conditions set in the setting part Sa, among all the board types produced by the board production facility 1, in a list format. Herein, the board type refers to the type of the component-mounted board to be produced, and in a case where the structure of the board before mounting the components thereon or the composition of the components to be mounted on the board is different, the board is treated as a different board type. As shown in FIG. 3, in the board type display part Sb, displayed is a list of board types produced by the target production line LA during the target period, which are set in the setting part Sa, and the board type (produced board type) and the production start date and time, the production end date and time, and the number of produced boards of the produced board type are displayed, being associated with one another. From the board type display part Sb, the manager can grasp the information on the board type produced by the target production line La during the target period.

The manager can perform an operation of selecting one board type, out of the plurality of (two) board types displayed in the board type display part Sb, on the input device 65. Then, the control part 61 displays a production number display part Sc and a production state display part Sd in response to the selection of one board type (FIG. 4).

Figure 4:
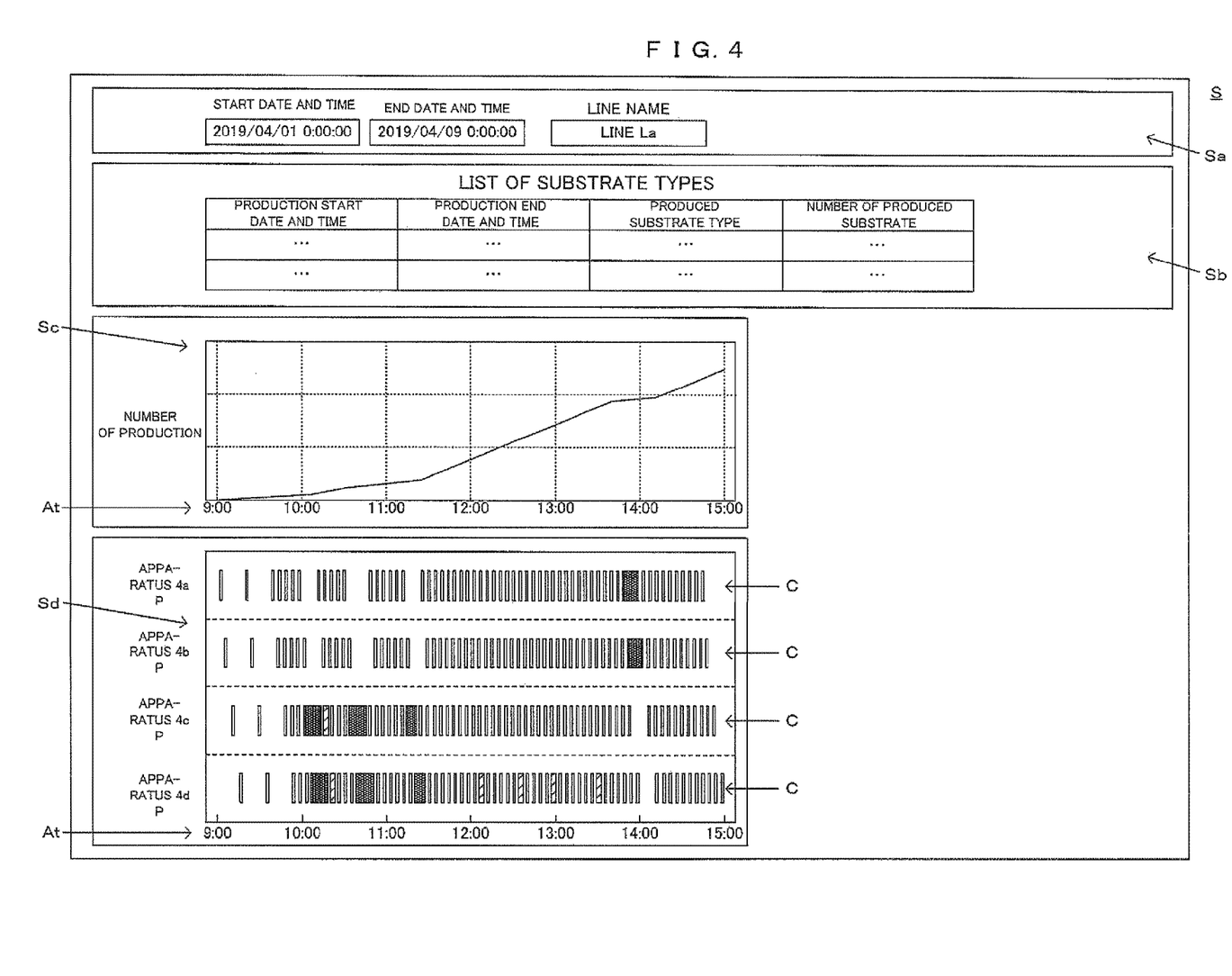
FIG. 4 is a view schematically showing an exemplary production management screen displayed on the display of the management apparatus.

FIG. 4 is a view schematically showing an exemplary production management screen displayed on the display of the management apparatus. The production number display part Sc is a graph with the horizontal axis as a time axis At and the vertical axis as the number of produced boards. This production number display part Sc shows a time change in the number of boards 10 of the one board type selected in the board type display part Sb, which are produced by the target production line La. From the production number display part Sc, the manager can grasp the number of boards 10 of the selected one board type, which are produced by the target production line La.

Figure 5:
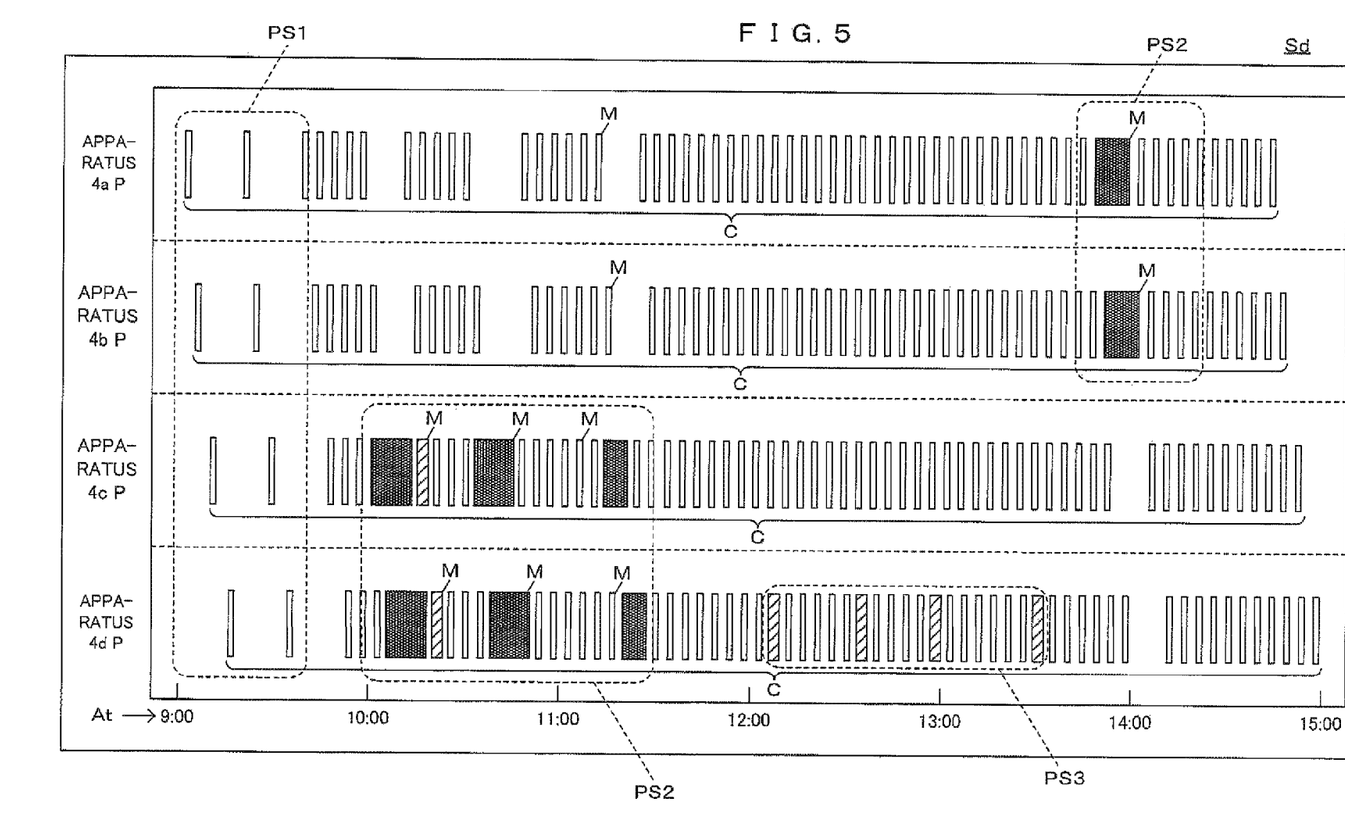
FIG. 5 is a view schematically showing an exemplary display content in a production state display part.
Figure 6:
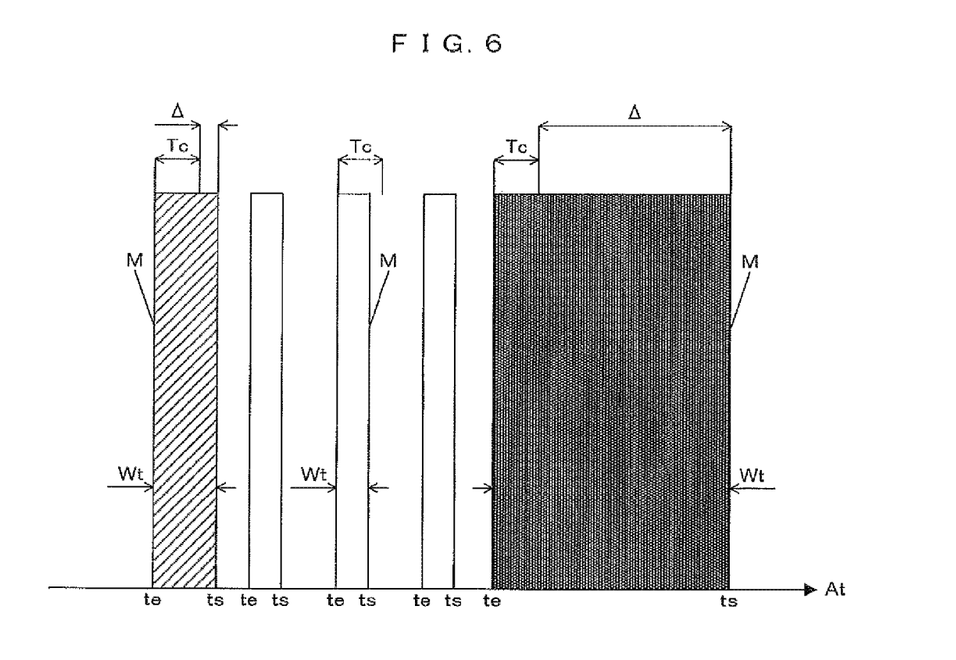
FIG. 6 is a view schematically showing an exemplary display content in the production state display part.

FIGS. 5 and 6 are views each schematically showing an exemplary display content in the production state display part. As shown in FIGS. 4 and 5, the production state display part Sd shows a timing chart C indicating an execution timing of a component mounting operation on the board 10 at the mounting operation position P for each of the plurality of (four) component mounters 4a to 4d included in the target production line La.

As described above, the target production line La includes a plurality of (four) component mounters 4a to 4d arranged in series in the X direction which is a transfer direction of the board 10. The target production line La causes mounting of the components on all mounting points provided on the board 10 to be shared by the component mounters 4a to 4d, to thereby produce the board 10 on which the components are mounted on all the mounting points. In other words, in the target production line La, the board 10 is sequentially transferred to the plurality of component mounters 4a to 4d. Each of the plurality of component mounters 4a to 4d fixes the board 10 transferred from the upstream side in the X direction to the mounting operation position P and then mounts the components onto each of assigned mounting points among all the mounting points on the board 10. Then, after completing the mounting of the components on each of the assigned mounting points, each of the component mounters 4a to 4d releases the fixing of the board 10 to the mounting operation position P and unloads the board 10 from the mounting operation position P toward the downstream side in the X direction.

On the other hand, the control part 61 calculates the execution timing when the component mounter 4 performs the component mounting operation on the board 10 at the mounting operation position P, on the basis of the log 622, and displays a mark M indicating the execution timing of the component mounting operation on the board 10, on the timing chart C. As shown in FIG. 6, this mark M has a width Wt depending on the time (operation time) needed for the component mounting operation on the corresponding board 10 (i.e., the board 10 which is a target of the component mounting operation whose execution timing is thereby indicated), along the time axis At. In other words, the width Wt of the mark M indicates a time period from the start time ts to the end time te of the component mounting operation whose execution timing is indicated by the mark M. Herein, the start time ts of the component mounting operation is the time when the component mounter 4 fixes the board 10 to the mounting operation position P, and the end time te of the component mounting operation is the time when the component mounter 4 releases the fixing of the board 10 to the mounting operation position P.

The control part 61 obtains the mark M for each of the plurality of boards 10 which are sequentially transferred to the mounting operation position P of the component mounter 4 and displays the mark M on the timing chart C. As a result, as illustrated in the production state display part Sd of FIGS. 4 and 5, in the timing chart C, a plurality of marks M corresponding to the plurality of boards 10 are arranged along the time axis At. In this timing chart C, each of the plurality of marks M is disposed at a position on the time axis At in accordance with the execution timing of the component mounting operation on the board 10 corresponding to the mark M, and further, each of the plurality of marks M has a width Wt depending on the operation time (=te−ts) needed to perform the component mounting operation on the corresponding board 10, along the time axis At.

Further, the control part 61 changes a color of the mark M displayed on the display 64, depending on the width Wt of the mark M (in other words, the operation time needed for the component mounting operation on the board 10 corresponding to the mark M). Specifically, the storage part 62 stores a reference cycle time Tc as a reference time needed for the component mounting operation on the board 10 at the mounting operation position P, and the control part 61 determines whether or not the width Wt of the mark M is equal or shorter than the reference cycle time Tc. Then, the control part 61 displays the mark M whose width Wt is equal or shorter than the reference cycle time Tc in green. In FIG. 6, for example, the width Wt of the mark M which is not hatched is equal or shorter than the reference cycle time Tc and the mark M is displayed in green (in white in FIGS. 4 to 6).

On the other hand, the control part 61 displays the mark M whose width Wt excesses the reference cycle time Tc in a color different from green. Especially, the color of the mark M is changed depending on the excess amount Δ (=Wt−Tc) by which the width Wt excesses the reference cycle time Tc. Specifically, by the control part 61, the mark M whose excess amount Δ obtained by subtracting the reference cycle time Tc from the width Wt is smaller than an excess threshold value is displayed in yellow, and the mark M whose excess amount Δ is not smaller than the excess threshold value is displayed in red. In FIG. 6, for example, the excess amount Δ of the width Wt of the mark M which is diagonally hatched is smaller than the excess threshold value and the mark M is displayed in yellow (diagonally hatched in FIGS. 4 to 6), and the excess amount Δ of the width Wt of the mark M which is dot-hatched is not smaller than the excess threshold value and the mark M is displayed in red (dot-hatched in FIGS. 4 to 6).

The control part 61 displays the timing chart C for each of the plurality of component mounters 4a to 4d in the production state display part Sd. The manager can grasp a history of the component mounting operation by each of the plurality of component mounters 4a to 4d, i.e., the execution timing and the operation time of the component mounting operation on the board 10, from the production state display part Sd, and can determine the state.

Specifically describing the exemplary case of FIG. 5, in a case where there is a space between adjacent marks M in the plurality of component mounters 4a to 4d as shown in a production state PS1, the manager can determine that the transfer of the board 10 from the upstream side in the X direction stagnates. In another case where there is a red (dot-hatched) mark M as shown in a production state PS2, the manager can determine that a breakdown for a relatively long time (a so-called "long time breakdown") occurs during the component mounting operation indicated by this mark M. In still another case where a yellow (diagonally-hatched) mark M frequently appears as shown in a production state PS3, the manager can determine that a breakdown for a relatively short time (a so-called "short time breakdown") occurs during the component mounting operation indicated by this mark M. In a further case where the widths Wt of the marks M at the mounting operation positions P (i.e., respective mounting operation positions P of the component mounters 4a to 4d) are nonuniform in the whole production state display part Sd, the manager can determine that the line balance is bad.

Further, the manager can perform a specification operation of specifying one mark M, out of the plurality of marks M displayed in the production state display part Sd, on the input device 65. Then, the control part 61 displays an operation time breakdown display part Se and an error detail display part Sf in response to the specification of one mark M (FIG. 7).

Figure 7:
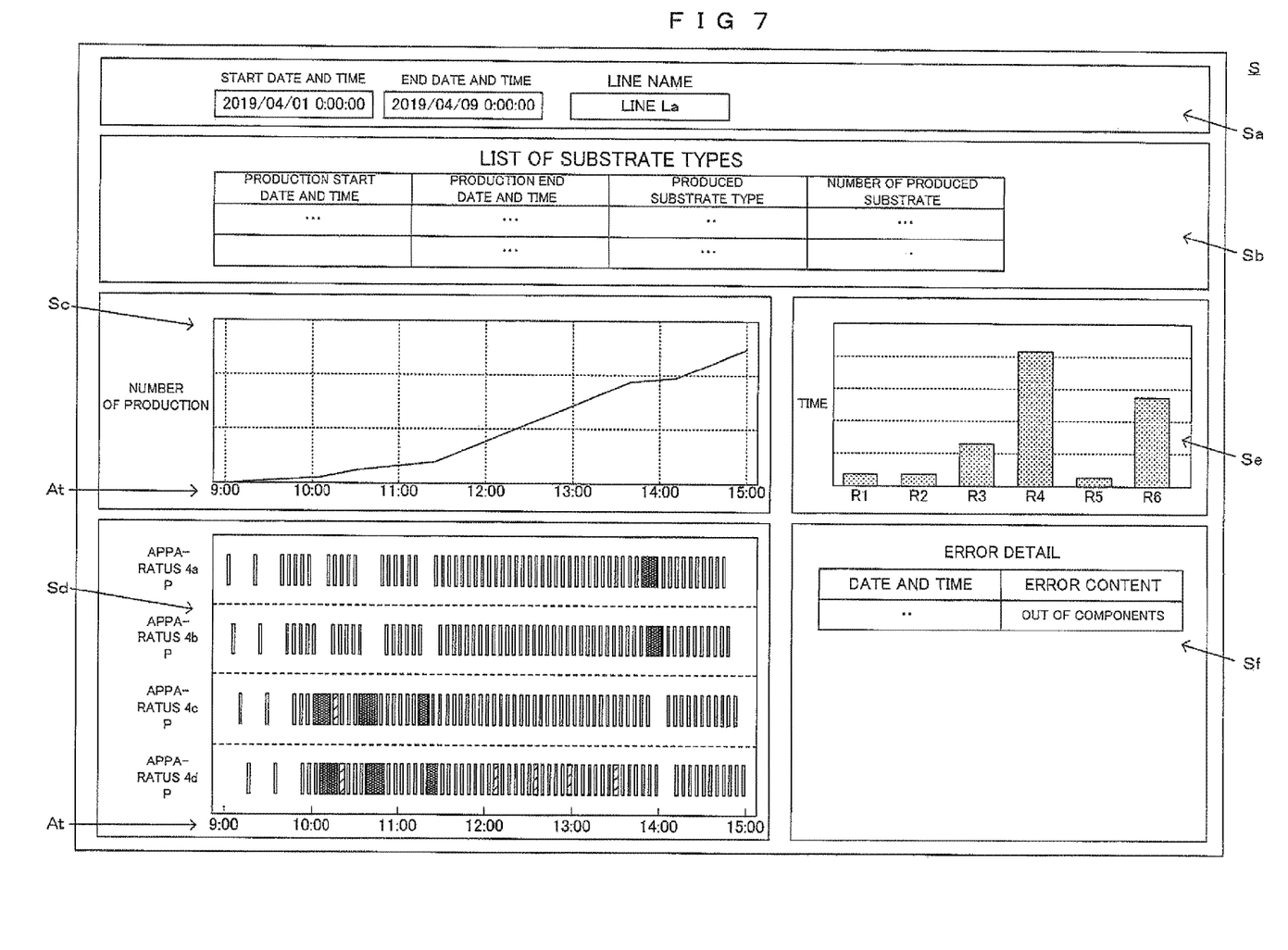
FIG. 7 is a view schematically showing still an exemplary production management screen displayed on the display of the management apparatus.

FIG. 7 is a view schematically showing an exemplary production management screen displayed on the display of the management apparatus. The operation time breakdown display part Se is a bar chart indicating respective times needed for a plurality of phenomena R1 to R6 occurring during the operation time (i.e., the time indicated by the width Wt) of the component mounting operation on the board 10 corresponding to the selected one mark M. In other words, the operation time breakdown display part Se shows the breakdown (constitution) of the operation time needed for the component mounting operation indicated by the one mark M.

The phenomenon R1 represents a phenomenon (downstream waiting) in which the component mounter 4 having a mounting operation position P at which the board 10 corresponding to the one mark M is positioned is waiting until the apparatus on the downstream side in the X direction from the component mounter 4 completes preparation for loading of the board 10. The phenomenon R2 represents a phenomenon (upstream waiting) in which the component mounter 4 having a mounting operation position P at which the board 10 corresponding to the one mark M is positioned is waiting until the apparatus on the upstream side in the X direction from the component mounter 4 completes preparation for unloading of the board 10. The phenomenon R3 represents a phenomenon (recovery) in which the component mounter 4 having a mounting operation position P at which the board 10 corresponding to the one mark M is positioned is waiting for resumption of operation after releasing an occurrence alarm of an error stop which is given to an operator. The phenomenon R4 represents a phenomenon (operator waiting) in which the component mounter 4 having a mounting operation position P at which the board 10 corresponding to the one mark M is positioned is waiting for release of the occurrence alarm after giving the occurrence alarm of the error stop to the operator. The phenomenon R5 represents a phenomenon (mark recognition) in which the component mounter 4 having a mounting operation position P at which the board 10 corresponding to the one mark M is positioned recognizes the fiducial mark on the board 10. The phenomenon R6 represents a phenomenon (mounting) in which the component mounter 4 having a mounting operation position P at which the board 10 corresponding to the one mark M is positioned mounts the components onto each of the assigned mounting points. The specific content of the phenomenon R includes, however, sometimes some of the plurality of phenomena exemplarily shown herein and other times a phenomenon different from the phenomena exemplarily shown herein.

Further, the error detail display part Sf shows information on an error occurring during the operation time (i.e., the time period indicated by the width Wt) of the component mounting operation on the board 10 corresponding to the selected one mark M. In this exemplary case, date and time of error occurrence and an error content (out of components in the feeder F) are displayed in the error detail display part Sf.

In the embodiment having the above-described configuration, the timing chart C indicating the execution history of the component mounting operation in the production lines La and Lb for producing the board 10 with the components mounted thereon by performing the component mounting operation (predetermined operation) on the board at the mounting operation position P while sequentially transferring the plurality of boards 10 to the mounting operation position P (operation position) is displayed on the display 64. In this timing chart C, the plurality of marks M corresponding to the plurality of boards 10, respectively, are arranged along the time axis At. Each of the marks M is disposed at a position on the time axis At in accordance with the execution timing of the component mounting operation on the board 10 corresponding to the mark M and has a width Wt depending on the operation time needed to perform the component mounting operation on the board 10 corresponding to the mark M along the time axis At. In other words, each of the plurality of marks M arranged along the time axis At in the timing chart C indicates the execution timing and the operation time of the component mounting operation on the corresponding board 10. Therefore, by checking this timing chart C, the manager can grasp the execution timing and the operation time of the component mounting operation on a board 10 basis. Thus, it becomes possible for the manager who manages the production of the boards 10 with components mounted thereon to easily grasp the operating state of the production lines La and Lb on a board-by-board basis.

Further, the control part 61 changes the color of the mark M depending on the excess amount Δ so that the plurality of marks M can each have a color depending on the excess amount Δ with respect to the reference cycle time Tc (reference time) of the operation time for the corresponding board 10. With such a configuration, the manager can easily distinguish the board 10 needing a long operation time by the color.

Furthermore, the input device 65 (specification part) receives the specification operation of specifying one mark M out of the plurality of marks M. Then, the control part 61 displays the information in accordance with the one mark M specified by the specification operation on the display 64 (the operation time breakdown display part Se or the error detail display part Sf). With such a configuration, by specifying one mark M, the manager can check the information in accordance with the one mark M on the display 64.

Further, the control part 61 displays the phenomena R1 to R6 occurring during the operation time for the board 10 corresponding to the one mark M and the time needed for the phenomena R1 to R6, on the display 64 (the operation time breakdown display part Se). With such a configuration, by specifying one mark M, the manager can check the phenomena R1 to R6 occurring during the operation time for the board 10 corresponding to the one mark M on the display 64.

Furthermore, the control part 61 displays an error occurring during the operation time for the board 10 corresponding to the one mark M on the display 64 (the error detail display part Sf). With such a configuration, by specifying one mark M, the manager can check the error occurring during the operation time for the board 10 corresponding to the one mark M on the display 64.

As described above, in the present embodiment, the management apparatus 6 corresponds to an exemplary "component mounting management apparatus" of the present disclosure, the control part 61 corresponds to an exemplary "control part" of the present disclosure, the display 64 corresponds to an exemplary "display" of the present disclosure, the input device 65 corresponds to an exemplary "specification part" of the present disclosure, the production management program 621 corresponds to an exemplary "component mounting management program" of the present disclosure, the recording medium 69 corresponds to an exemplary "recording medium" of the present disclosure, the production lines La and Lb each correspond to an exemplary "component mounting system" of the present disclosure, the mounting operation position P corresponds to an exemplary "operation position" of the present disclosure, the board 10 corresponds to an exemplary "board" of the present disclosure, the component mounting operation corresponds to an exemplary "predetermined operation" of the present disclosure, the timing chart C corresponds to an exemplary "chart" of the present disclosure, the mark M corresponds to an exemplary "mark" of the present disclosure, the width Wt corresponds to an exemplary "width" of the present disclosure, and the time axis At corresponds to an exemplary "time axis" of the present disclosure.

Further, the present disclosure is not limited to the above-described embodiment, and numerous modifications and variations can be added to those described above without departing from the scope of the disclosure. The control over the color of the mark M to be displayed on the display 64 can be modified in the following manners.

In this variation, the manager receives a setting operation of setting an excess threshold value (which corresponds to the correspondence between the excess amount Δ and the color of the mark M) used with respect to the excess amount Δ of the width Wt of the mark M. Then, the control part 61 changes the color of the mark M depending on the excess amount Δ in the same way as above in accordance with the set excess threshold value. In such a variation, by operating the input device 65 (setting part) to change the excess threshold value, the manager can check the board 10 needing a long operation time by the color while changing the color of the mark M depending on the operation time.

Furthermore, the control by the control part 61 may be modified so that a content different from the above can be further displayed on the production management screen S of the display 64. Specifically, in a first variation, a report showing at least one of the following contents is displayed on the display 64:

the number of boards 10 on which the operation time of the component mounting operation exceeds the reference cycle time Tc in the target production line La the excess amount Δ (excess time) of each of the boards 10 on which the operation time of the component mounting operation exceeds the reference cycle time Tc in the target production line La the total of the excess amounts A (the total of the excess times) of the boards 10 on each of which the operation time of the component mounting operation exceeds the reference cycle time Tc in the target production line La Such a display helps the manager to analyze the factor of causing a long operation time to be needed.

In a second variation, the control part 61 classifies the plurality of marks M of the target production line La in accordance with the respective colors (green, yellow, red). Then, the control part 61 displays the information on the board 10 corresponding to the mark M, specifically, the type (board type) of the board 10 or a board ID for identifying the board 10 in a list format for each color of the marks M on the display 64. In other words, this list shows a correspondence between the color of the mark M and the information (the board type or the board ID) on the board 10 corresponding to each of the marks M having the color, for each color. Thus, the display of the information on the board 10 for each color of the corresponding mark M in a list format on the display 64 helps the manager to analyze the factor of causing a long operation time to be needed.

In a third variation, when the manager performs the specification operation of specifying one mark M, out of the plurality of marks M displayed in the production state display part Sd, on the input device 65, the control part 61 displays the information (the board type or the board ID) on the board corresponding to the specified one mark M on the display 64. Such a display is performed, for example, by causing a text indicating the information to pop up. With such a configuration, by specifying one mark M in the specification operation, the manager can check the information on the board 10 corresponding to the one mark M on the display 64.

In a fourth variation, the control part 61 displays the information (the board type or the board ID) on the board 10 on which the component mounting operation is performed at the mounting operation positions P of the plurality of component mounters 4a to 4d in a list format for each (equipment) of the plurality of component mounters 4a to 4d on the display 64. In other words, this list shows a correspondence between the component mounter 4 and the information on the board 10 on which the component mounting operation is performed at the mounting operation position P of the component mounter 4, for each of the component mounters 4a to 4d. With such a configuration, the manager can check the information on the board 10 for each of the component mounters 4a to 4d.

Further, various modifications different from these exemplary cases can be added. For example, the width Wt of the mark M, i.e., the start time ts and the end time te of the component mounting operation indicated by the mark M may be changed from the above exemplary case. Specifically, the end time te of the component mounting operation may be the time when the component mounter 4 which performs the component mounting operation completes the component mounting onto each of the assigned mounting points out of all the mounting points on the board 10. Alternatively, there may be a configuration where the manager can arbitrarily set the start time ts and the end time te by operating the input device 65.

Furthermore, the kinds of colors of the marks M are not limited to three colors described above but may be four colors or more, or two colors. Alternatively, the marks M may be displayed without color coding.

Further, the number of mounting operation positions P which one component mounter 4 has is not limited to one but may be two or more.

Furthermore, the number of production lines L included in the board production facility 1 is not limited to the exemplary number as described above but may be, for example, one.

Further, the number of component mounters 4 constituting the production line L may be changed as appropriate.

What is claimed is:

1. A component mounting management apparatus, comprising:
    a display; and
    a controller configured to control displaying of a chart on the display, the chart indicating an execution history of a predetermined operation in a component mounting system which produces a component-mounted board by performing the predetermined operation on a board at an operation position while sequentially transferring a plurality of boards to the operation position,
    wherein in the chart, by disposing a mark corresponding to the board at a position on a time axis in accordance with an execution timing of the predetermined operation on the board corresponding to the mark, a plurality of marks corresponding to the plurality of boards are arranged along the time axis,
    each of the plurality of marks has a width, along the time axis, depending on an operation time needed to perform the predetermined operation on the corresponding board, and
    the controller is configured to change a color of the mark depending on an excess amount so that the plurality of marks each have a color depending on an excess amount of the operation time on the corresponding board with respect to a reference time.

2. The component mounting management apparatus according to claim 1, further comprising:
    a setting input configured to receive a setting operation of a manager who sets a correspondence between the excess amount and the color of the mark,
    wherein the controller is configured to change the color of the mark depending on the excess amount in accordance with the correspondence.

3. The component mounting management apparatus according to claim 2, wherein
    the controller is configured to control displaying of a number of boards, among the plurality of boards, each whose operation time exceeds the reference time, an excess time of each board whose operation time exceeds the reference time, or the total of the excess times of all the boards each whose operation time exceeds the reference time, on the display.

4. The component mounting management apparatus according to claim 2, wherein
    the controller is configured to control displaying of information pertaining to the board, for each color of the corresponding mark, in a list format on the display.

5. The component mounting management apparatus according to claim 2, further comprising:
    a specification input configured to receive a specification operation of specifying one mark out of the plurality of marks,
    wherein the controller is configured to control displaying of information in accordance with the one mark specified by the specification operation, on the display.

6. The component mounting management apparatus according to claim 2, wherein
    the component mounting system comprises a plurality of equipments each having the operation position, and
    the controller is configured to control displaying of information on the board on which the predetermined operation is performed at the operation position of the equipment, for each equipment, in a list format on the display.

7. The component mounting management apparatus according to claim 1, wherein
    the controller is configured to control displaying of a number of boards, among the plurality of boards, each whose operation time exceeds the reference time, an excess time of each board whose operation time exceeds the reference time, or the total of the excess times of all the boards each whose operation time exceeds the reference time, on the display.

8. The component mounting management apparatus according to claim 7, further comprising:
    a specification input configured to receive a specification operation of specifying one mark out of the plurality of marks,
    wherein the controller is configured to control displaying of information in accordance with the one mark specified by the specification operation, on the display.

9. The component mounting management apparatus according to claim 7, wherein
    the component mounting system comprises a plurality of equipments each having the operation position, and
    the controller is configured to control displaying of information on the board on which the predetermined operation is performed at the operation position of the equipment, for each equipment, in a list format on the display.

10. The component mounting management apparatus according to claim 1, wherein
the controller is configured to control displaying of information pertaining to the board, for each color of the corresponding mark, in a list format on the display.

11. The component mounting management apparatus according to claim 10, further comprising:
a specification input configured to receive a specification operation of specifying one mark out of the plurality of marks,
wherein the controller is configured to control displaying of information in accordance with the one mark specified by the specification operation, on the display.

12. The component mounting management apparatus according to claim 1, further comprising:
a specification input configured to receive a specification operation of specifying one mark out of the plurality of marks,
wherein the controller is configured to control displaying of information in accordance with the one mark specified by the specification operation, on the display.

13. The component mounting management apparatus according to claim 12, wherein
the controller is configured to control displaying of information on the board corresponding to the one mark, on the display.

14. The component mounting management apparatus according to claim 12, wherein
the controller is configured to control displaying of a phenomenon occurring during the operation time for the board corresponding to the one mark and time needed for the phenomenon, on the display.

15. The component mounting management apparatus according to claim 12, wherein
the controller is configured to control displaying of an error occurring during the operation time for the board corresponding to the one mark, on the display.

16. The component mounting management apparatus according to claim 1, wherein
the component mounting system comprises a plurality of equipments each having the operation position, and
the controller is configured to control displaying of information on the board on which the predetermined operation is performed at the operation position of the equipment, for each equipment, in a list format on the display.

17. A component mounting management method, comprising:
displaying a chart, on a display, which indicates an execution history of a predetermined operation in a component mounting system which produces a component-mounted board by performing the predetermined operation on a board at an operation position while sequentially transferring a plurality of boards to the operation position,
wherein in the chart, by disposing a mark corresponding to the board at a position on a time axis in accordance with an execution timing of the predetermined operation on the board corresponding to the mark, a plurality of marks corresponding to the plurality of boards are arranged along the time axis, and
each of the plurality of marks has a width, along the time axis, depending on an operation time needed to perform the predetermined operation on the corresponding board; and
changing a color of the mark depending on an excess amount so that the plurality of marks each have a color depending on an excess amount of the operation time on the corresponding board with respect to a reference time.

18. A non-transitory machine-readable storage medium storing a component mounting management program configured to cause a computer to execute:
displaying a chart, on a display, which indicates an execution history of a predetermined operation in a component mounting system which produces a component-mounted board by performing the predetermined operation on a board at an operation position while sequentially transferring a plurality of boards to the operation position,
wherein in the chart, by disposing a mark corresponding to the board at a position on a time axis in accordance with an execution timing of the predetermined operation on the board corresponding to the mark, a plurality of marks corresponding to the plurality of boards are arranged along the time axis, and
each of the plurality of marks has a width, along the time axis, depending on an operation time needed to perform the predetermined operation on the corresponding board; and
changing a color of the mark depending on an excess amount so that the plurality of marks each have a color depending on an excess amount of the operation time on the corresponding board with respect to a reference time.

\* \* \* \* \*